United States Patent [19]

Takenaka

[11] Patent Number: 5,691,933

[45] Date of Patent: Nov. 25, 1997

[54] SEMICONDUCTOR MEMORY DEVICE HAVING IMPROVED BIT LINE DISTRIBUTION

[75] Inventor: Hiroyuki Takenaka, Kanagawa-ken, Japan

[73] Assignee: Kabushiki Kaisha Toshiba, Tokyo, Japan

[21] Appl. No.: 769,185

[22] Filed: Dec. 18, 1996

Related U.S. Application Data

[63] Continuation of Ser. No. 571,559, Dec. 13, 1995, abandoned.

[30] Foreign Application Priority Data

Dec. 16, 1994 [JP] Japan .................................. 6-312990

[51] Int. Cl.[6] ...................................................... G11C 5/06
[52] U.S. Cl. ........................... 365/63; 365/51; 365/149; 365/230.03
[58] Field of Search ............................... 365/51, 63, 149, 365/230.03

[56] References Cited

U.S. PATENT DOCUMENTS

| | | | |
|---|---|---|---|
| 4,903,344 | 2/1990 | Inoue | 365/51 |
| 5,014,241 | 5/1991 | Asakura et al. | 365/51 |
| 5,272,665 | 12/1993 | Uesugi | 365/63 |
| 5,383,159 | 1/1995 | Kubota | 365/210 |

FOREIGN PATENT DOCUMENTS

| | | |
|---|---|---|
| 031659 | 7/1981 | European Pat. Off. . |
| 278155 | 8/1988 | European Pat. Off. . |
| 496406 | 7/1992 | European Pat. Off. . |

OTHER PUBLICATIONS

Masato Matsumiya, et al., "A 15-ns 16-Mb CMOS SRAM with Interdigitated Bit-Line Architecture", IEEE Journal of Solid-State Circuits, vol. 27, No. 11, Nov. 1992.

Primary Examiner—Son T. Dinh
Attorney, Agent, or Firm—Loeb & Loeb LLP

[57] ABSTRACT

A dynamic-type semiconductor memory including a memory cell array having a first, a second, a third and a fourth pair of bit lines which are arranged in parallel. A first sense amplifier circuit is arranged contiguous to one side of the memory cell array and is coupled to the first pair of bit lines. A second and a third sense amplifier circuit are arranged contiguous to the other side of the memory cell array and are coupled respectively to the second and the third pair of bit lines. A fourth sense amplifier circuit is arranged contiguous to the same side of the memory cell array as the first sense amplifier circuit and is coupled to the fourth pair of bit lines. In a preferred embodiment, a first signal line is connected to a second signal line at a region bounded by the ends of the second and the third bit line pairs and the first and the fourth sense amplifier circuits, thereby achieving low resistance for the equalizing signal lines, while maintaining a bit line arrangement of a mostly packed structure.

20 Claims, 9 Drawing Sheets

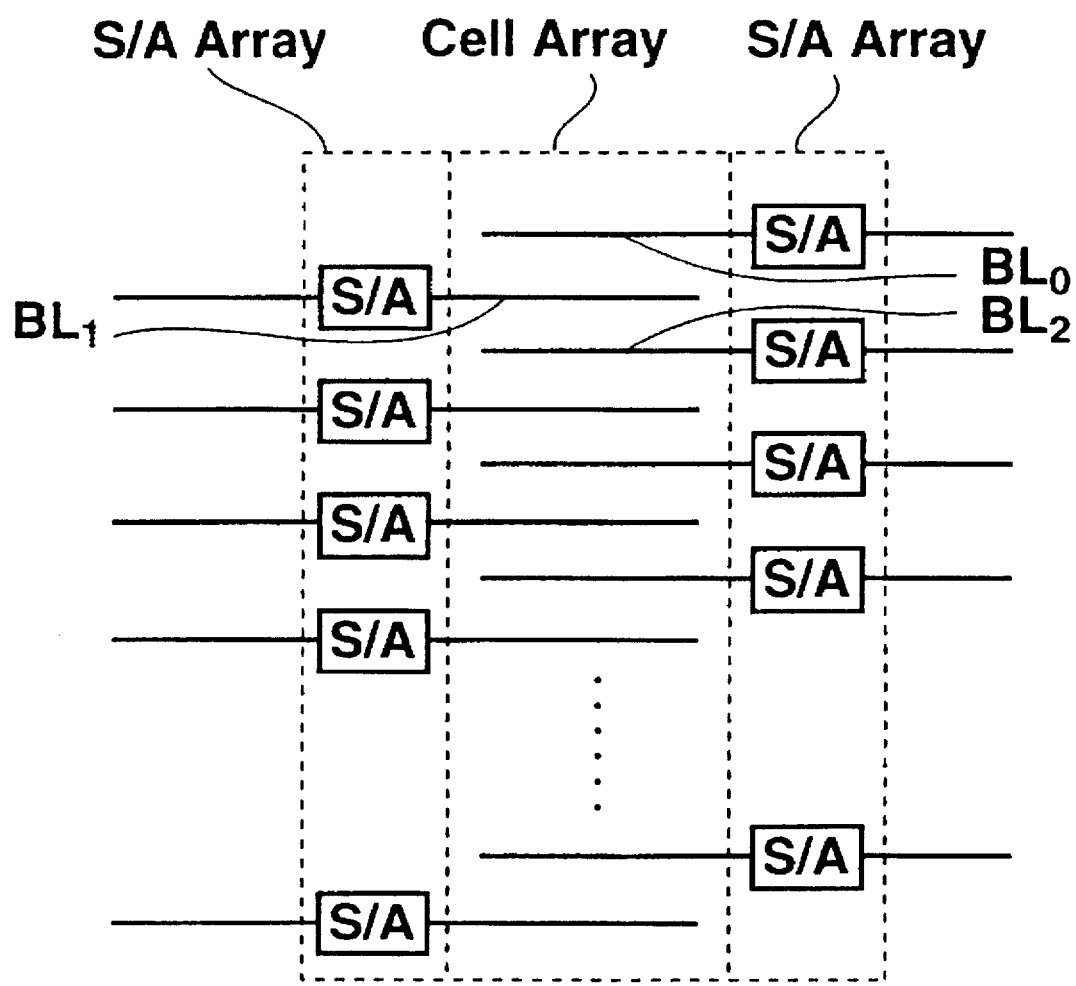

SEMICONDUCTOR MEMORY DEVICE HAVING IMPROVED BIT LINE DISTRIBUTION

This is a continuation of application Ser. No. 08/571,559, filed Dec. 13, 1995, now abandoned.

FIELD OF THE INVENTION

The present invention relates to a semiconductor memory, and more specifically to a dynamic-type semiconductor memory having a structure that reduces pattern area through arrangement of the sense amplifier arrays, which are located on both sides of a cell array composed of dynamic-type memory cells arranged in a matrix.

BACKGROUND OF THE INVENTION

In this specification, it is assumed that the circuits are operating under positive logic. Specifically, an "H" level signal is equal to logic 1, which is approximately the internal power source potential Vcc (or at least a voltage high enough to turn a transistor on when applied to its gate if the potential at its source is approximately the ground potential Vss). An "L" level signal is equal to logic 0, which is approximately the ground potential Vss.

Conventionally, efforts in reducing pattern area in a dynamic random access semiconductor memory (hereinafter, DRAM) have been performed by adopting a shared sense amplifier structure. FIG. 8 shows an example of a DRAM memory cell unit having the shared sense amplifier structure. Sense amplifier arrays (S/A Array1 and S/A Array2) are arranged on the left and right sides of a memory cell array (Cell Array). Pairs of bit lines are arranged in parallel with each other in the Cell Array. The first pair of bit lines BL0 in the memory cell array is connected to a sense amplifier circuit S/A in the right sense amplifier array (S/A Array2), the second pair of bit lines BL1 is connected to a sense amplifier circuit S/A in the left sense amplifier array (S/A Array1), and so on. Accordingly, the number of sense amplifier circuits present in each of the sense amplifier arrays (S/A Array1 and S/A Array2) is half the number of pairs of bit lines (N/2, where N equals the number of bit line pairs). The pairs of bit lines extend from both sense amplifier arrays to be coupled to pairs of bit lines of contiguous memory cell arrays, not shown. During actual operation, a select circuit (described later) is used to couple the sense amplifier circuit to either the right side or the left side bit line pairs. For example, when the memory cell array (Cell Array) in FIG. 8 is activated by reading, writing or refreshing operations, the sense amplifier arrays (S/A Array1 and S/A Array2) on the left and right sides of the memory cell array are coupled to the memory cell array to amplify memory cell data.

FIG. 9 shows in more detail a sense amplifier circuit S/A from FIG. 8. This sense amplifier circuit S/A can be divided into a left plane equalizing section, a left plane selecting section, a column gate section, a sense amplifier section, a right plane selecting section, and a right plane equalizing section. The left plane equalizing section, composed of N-channel MOS transistors Q1, Q2 and Q3, equalizes the left plane pair of bit lines BL1 and /BL1 to ½ Vcc under the control of a signal φEQL (Vcc is the internal power source potential, ½ Vcc is supplied by line VBL). The left plane selecting section, composed of N-channel MOS transistors Q4 and Q5, couples the column gate section and the sense amplifier section to the left plane pair of bit lines BL1 and /BL1 under the control of a signal φL. The column gate section, composed of N-channel MOS transistors Q6 and Q7, selectively couples the pair of bit lines to a pair of data lines DQ and /DQ under the control of a column select line CSL. The sense amplifier section, composed of N-channel MOS transistors Q8 through Q11 and P-channel MOS transistors Q12 and Q13, amplifies a very small potential difference between the pair of bit lines. The right plane selecting section, composed of N-channel MOS transistors Q14 and Q15, couples the column gate section and the sense amplifier section to a right plane pair of bit lines BL1' and /BL1' under the control of a signal φR. The right plane equalizing section, composed of N-channel MOS transistors Q16, Q17 and Q18, equalizes the right plane pair of bit lines BL1' and /BL1' to ½ Vcc (i.e., VBL) under the control of a signal φEQR.

Specifically, a left side pair of bit lines (BL1 and /BL1) is coupled to a pair of bit lines (BL and /BL) via the N-channel MOS transistors Q4 and Q5 when driven by a signal line φL. Similarly, a right side pair of bit lines (BL1' and /BL1') is coupled to the pair of bit lines (BL and /BL) via the N-channel MOS transistors Q14 and Q15 when driven by another signal line φR. An N-channel sense amplifier, composed of N-channel MOS transistors Q8 and Q9, and a P-channel sense amplifier, composed of P-channel MOS transistors Q12 and Q13, are connected to the pair of bit lines (BL and /BL). The drive terminal 12 of the N-channel sense amplifier is coupled to /SEL through a MOS transistor Q10 driven by the column select line CSL and to /SAN through a MOS transistor Q11, which functions as a resistor element because its gate is connected to Vcc. The drive terminal 11 of the P-channel sense amplifier is connected to a P-channel sense amplifier dire line SAP. Further, the bit lines (BL and /BL) are respectively coupled to data lines (DQ and /DQ) via MOS transistors Q6 and Q7 when driven by the column select line CSL. A very small potential difference between the data lines (DQ and /DQ) will be amplified to a logic level signal by data line amplifying circuits, not shown. An equalizing circuit, composed of MOS transistors Q1, Q2 and Q3, equalizes the left plane pair of bit lines BL1 and /BL1 to ½ Vcc when driven by a signal φEQL (½ Vcc is supplied by line VBL). Similarly, another equalizing circuit, composed of MOS transistors Q16, Q17 and Q18, equalizes the right plane pair of bit lines BL1' and /BL1' to ½ Vcc when driven by a signal φEQR.

An explanation will now be given of the operation of the sense amplifier circuit S/A shown in FIGS. 8 and 9. For this explanation, it will be assumed that the selected memory cell MC is coupled to the left side pair of bit lines (BL1 and /BL1). The signal line φL becomes "H" level so the MOS transistors Q4 and Q5 become conductive and the left side pair of bit lines (BL1 and /BL1) is coupled to the pair of bit lines (BL and /BL). The signal line φR becomes "L" level so the MOS transistors Q14 and Q15 become nonconductive and the right side pair of bit lines (BL1' and /BL1') is disconnected from the pair of bit lines (BL and /BL). The signal φEQL changes from "H" level to "L" level so the equalizing operation is released. Successively, when the word line, not shown, is activated, the dynamic-type memory cell MC is selected and a very small potential difference is caused between the pair of bit lines (BL and /BL).

Next, the potentials of the first and second N-channel sense amplifier drive lines /SAN and /SEL change from ½ Vcc (which is approximately half of the internal power source voltage) to Vss (ground potential). Then, the very small potential difference between the pair of bit lines is amplified by the MOS transistors Q8 and Q9 and the potential of either BL or /BL is drawn more to the side of Vss. In a selected column, the column select line CSL is changed to "H" level so the MOS transistor Q10 becomes conductive and the sense amplifier S/A connected to that CSL is activated at a higher speed than sense amplifiers in columns that are not selected (where CSL is "L" level). Similarly, in the parallel P-channel sense amplifier, the potential of the P-channel sense amplifier drive line SAP is raised from ½ Vcc to Vcc. Then, the very small potential difference between the pair of bit lines is amplified by the MOS transistors Q12 and Q13 and the potential of either BL or /BL is drawn more to the side of Vcc. As a result, after a predetermined time period has elapsed, the potentials of both the left side pair of bit lines and the pair of bit lines (BL and /BL) are amplified to the logic level signal of Vcc/Vss. Finally, this amplified potential difference is transferred from the pair of bit lines to the pair of data lines (DQ and /DQ) via the column select transistors Q6 and Q7, is converted into a logic level signal by a data line amplifying circuit, and is read outside the chip as output data.

An explanation of the case where the selected memory cell MC is coupled to the right side pair of bit lines (BL1' and /BL1') will be omitted because it is so analogous to the above-explained case where the selected memory cell is coupled to the left side pair of bit lines (BL1 and /BL1).

The above explanation has been given for a DRAM having a conventional shared sense amplifier structure. With such a structure, it is possible to arrange the sense amplifier circuit with a pitch twice as much as the pitch (interval) of the bit lines which facilitates pattern arrangement and contributes to a reduction in chip area. Chip area is further reduced because the sense amplifier arrays are commonly used by contiguous memory cell arrays. Thus, the sense amplifier region is half the size it would be if a sense amplifier array were provided for every memory cell array.

However, there are problems in the conventional DRAM having the shared sense amplifier structure. In the case where the equalizing circuit signal lines (φEQL, φEQR, VBL and the like) are formed by polysilicon wirings or wirings of impurity diffusion, the resistance is excessively large. Thus, the operational margin is lowered and erroneous operation can result. Further, with the mostly packed structure of a conventional DRAM, it is very difficult to arrange bypass wiring for these signal lines (φEQL, φEQR, VBL and the like) in the metal wiring layers which have low resistance. This is because it is difficult to provide a connection region to bring together the metal wiring layer and the high resistance wiring layer (polysilicon wiring or wiring of impurity diffusion) in the conventional DRAM having the shared sense amplifier structure due to the mostly packed structure. Therefore, in order to achieve low resistance, it is necessary to sacrifice chip area by making the pitch of the bit lines wider.

SUMMARY OF THE INVENTION

In view of these problems, it is the object of the present invention to remove the above-mentioned drawbacks and to provide a dynamic-type semiconductor memory which achieves low resistance for the equalizing signal lines and the like, while maintaining a bit line arrangement of a mostly packed structure.

According to the present invention, a constant space is provided between the first and second pairs of bit lines and their opposing sense amplifier circuit. Therefore, it is possible to provide a connection region for the equalizing circuit signal lines. Further, a constant space is similarly provided between the third and fourth pairs of bit lines and their opposing sense amplifier circuit. This is done while maintaining the mostly packed structure of the bit line arrangement. As a result, it is possible to achieve low resistance for the equalizing circuit signal lines and the like, without increasing chip area.

BRIEF DESCRIPTION OF THE DRAWINGS

FIG. 8 is a plane view showing a core part of a conventional dynamic-type semiconductor memory.

DETAILED DESCRIPTION OF THE PREFERRED EMBODIMENTS

The embodiments of the present invention will be described in detail hereinbelow with reference to the attached drawings.

Figure 1:
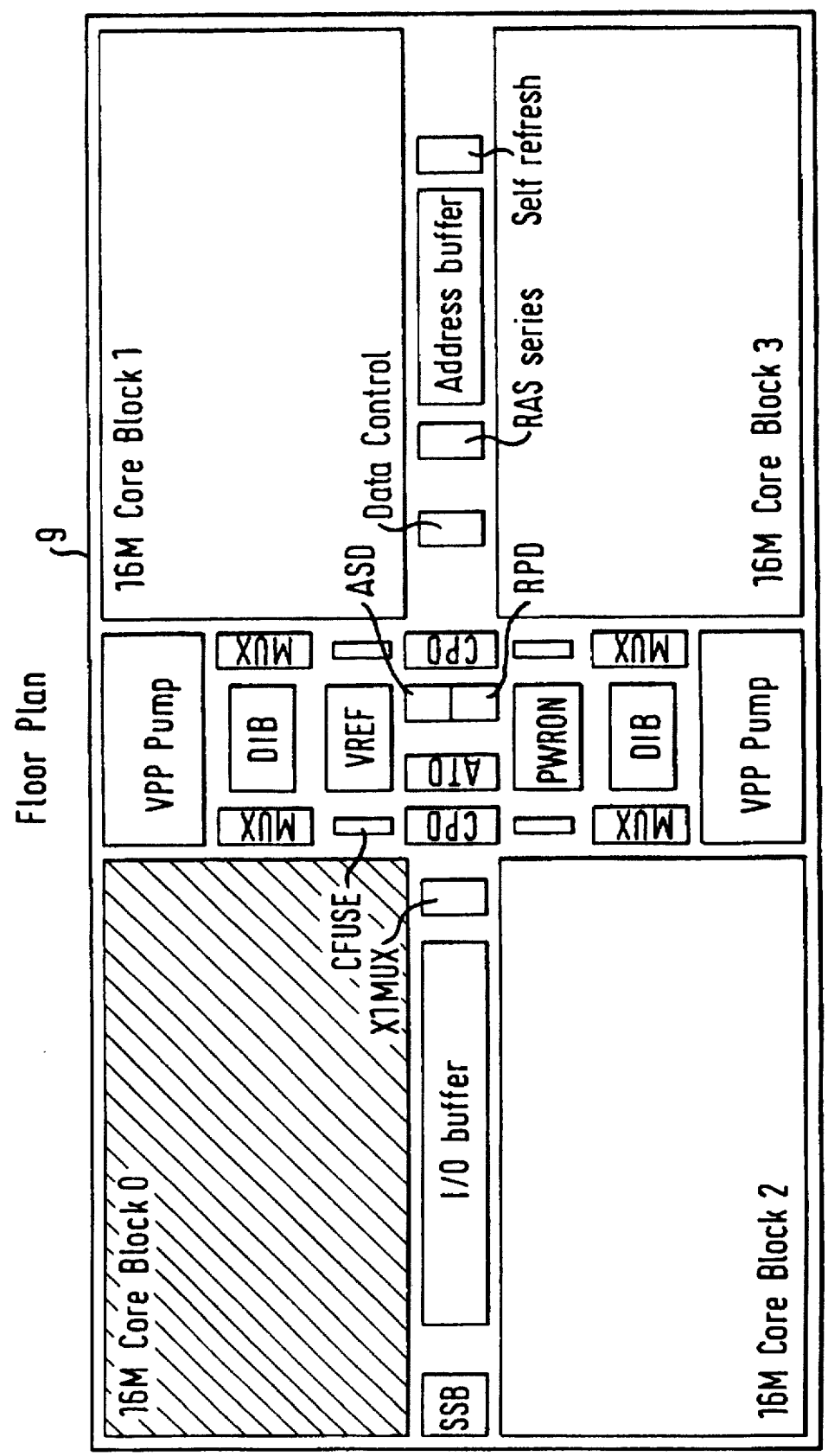
FIG. 1 is a plane view showing an embodiment of the present invention.

FIG. 1 shows an outline structural view of a DRAM of the present invention. The total memory capacity is assumed to be 64M bits. Core blocks CB0, CB1, CB2 and CB3 are arranged in a semiconductor chip 9. Each core block CB is composed of 16M bits of memory cells and their peripheral circuits, such as sense amplifiers, decoders and the like. Vpp generating circuits (Vpp Pump1 and Vpp Pump2), for generating a boosted voltage Vpp of a word line, are respectively arranged between CB0 and CB1, and CB2 and CB3. Data multiplexer circuits (MUX0 through MUX3) and data buffer circuits (DIB1 and DIB2) are arranged at data output units of the core blocks CB. A fuse array CFUSE, for holding replaced data of the column redundancy circuits, is located adjacent to each of the core blocks. A reference potential generating circuit VREF, for generating a reference or intermediate potential of ½ Vcc, is arranged between CB0 and CB1. A power-on reset circuit PWRON, for generating an initializing signal when the chip is initialized with the power source on, is arranged between CB2 and CB3. A substrate potential generating circuit SSB, a data input/output buffer (I/O Buffer and Pad), and a I/O data multiplexer circuit X1MUX, for selecting Pad in accordance with data output width, are successively arranged between CB0 and CB2. A self refresh control circuit (Self Refresh), an address buffer (Address Buffer), a row series control circuit (RAS Series), and a data control circuit (DC) are successively arranged between CB1 and CB3. Additionally, column partial decoder circuits (CPD), an address transition detection circuit (ATD), a row partial decoder circuit (RPD), and a column address switch circuit (ASD) are arranged at the central portion of the chip 9.

Figure 2:
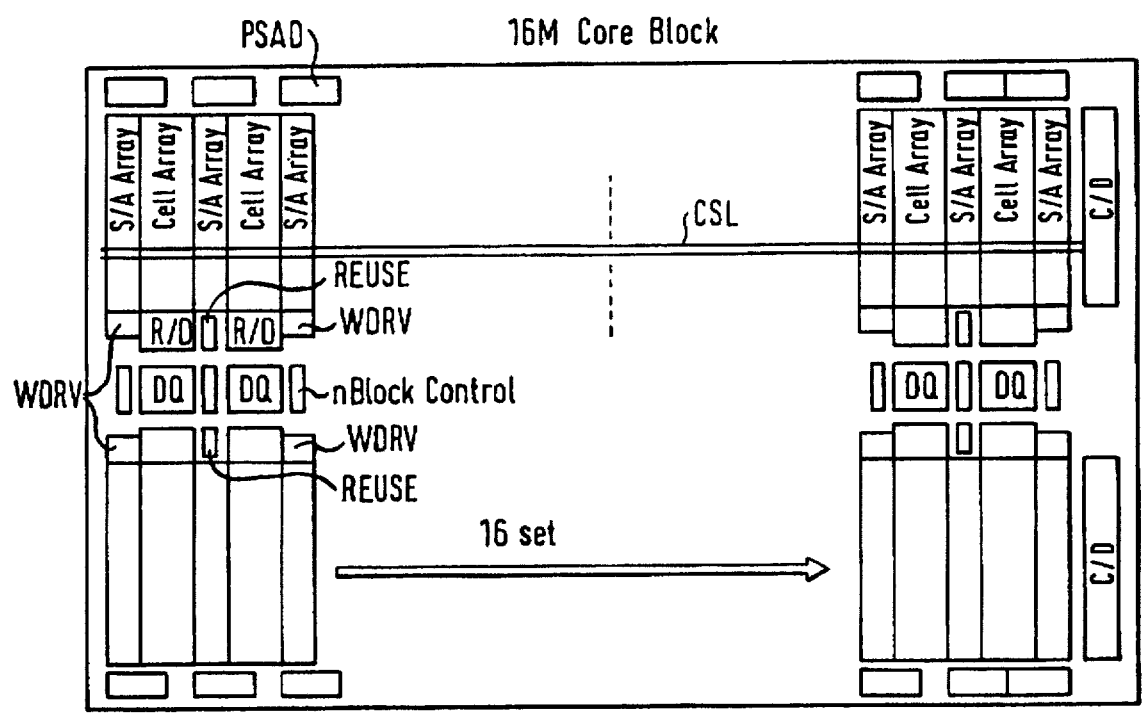
FIG. 2 is a plane view showing in detail the embodiment of the present invention.

FIG. 2 shows the structure of a 16M bits core block CB. Thirty-two memory cell arrays (Cell Array1 through Cell Array32) and thirty-four sense amplifier arrays (peripheral circuits within a core section) (S/A Array1 through S/A Array34) are alternately arranged to form a memory cell block. Column decoder circuits (C/D1 and C/D2) are arranged at one end of the core block. A plurality of column select lines CSL, which extend in the row direction, are selectively driven by the column decoder circuits C/D. The column select lines CSL supply select signals to the sense amplifier arrays (S/A Array) belonging to the selected column. Specifically, the column select lines are used for partial activation of the sense amplifier circuits and for driving the column gate circuits. The memory cell block is divided into top and bottom groups of memory cell arrays. Between these two groups are arranged: i) row decoder circuits R/D, for selective driving word lines WL by internal row address signals (each R/D corresponds to a memory cell array); ii) drive circuits WDRV, for supplying drive signals to the row decoder circuits; iii) fuse circuits RFUSE, for holding replaced data of row redundancy circuits; iv) data line amplifying circuits DQB; and v) a block control circuit BC. P-channel type sense amplifier drive circuits PSAD, each corresponding to a peripheral circuit (S/A Array) within the core section, are arranged at peripheral portions of the core block CB. These circuits combine to form a 16M bits core block CB.

Figure 3:
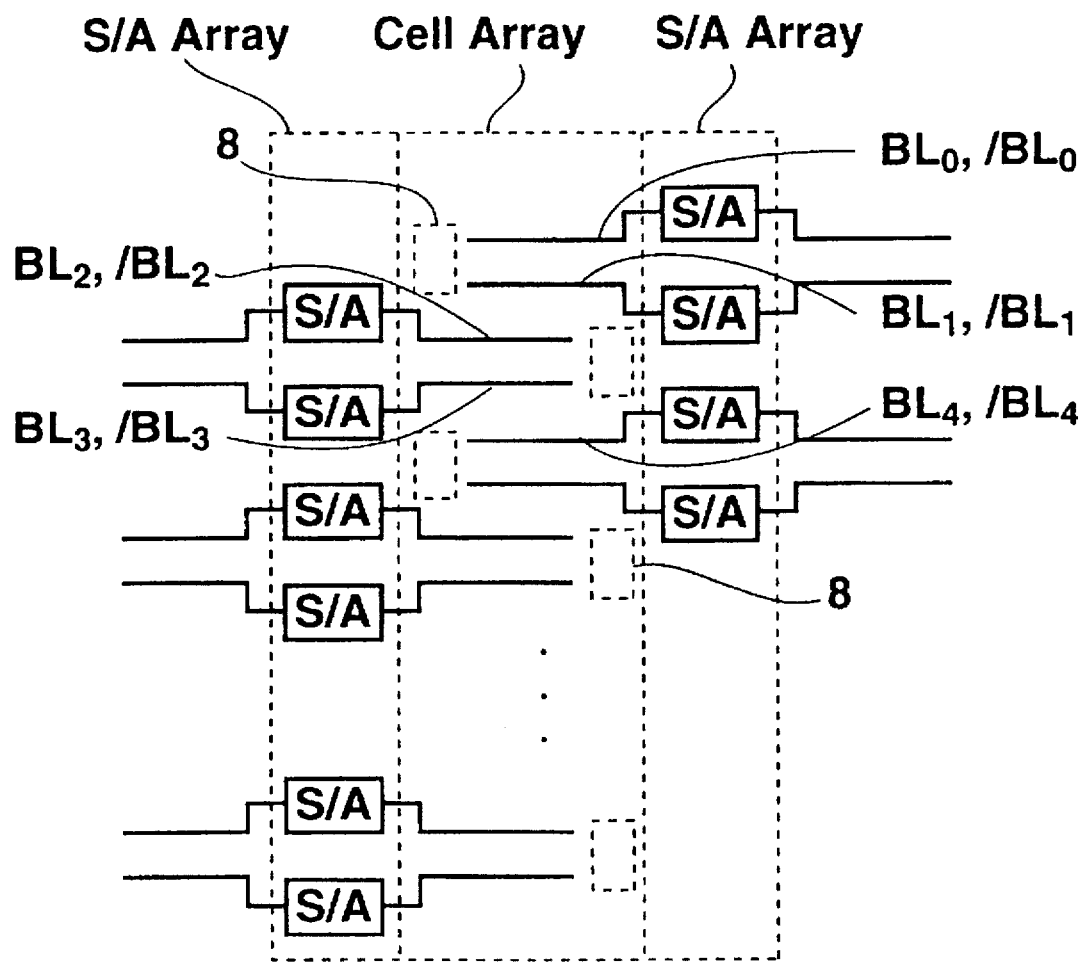
FIG. 3 is a plane view showing in more detail the embodiment of the present invention.

FIG. 3 shows the structure of a memory cell array (Cell Array) and its two adjoining sense amplifier arrays (S/A Array1 and S/A Array2). The memory cell array is of the shared sense amplifier structure in which two pairs of bit lines (for example BL0 and /BL0, and BL0' and /BL0') are connected to each of the sense amplifier circuits S/A. Further, every two sense amplifiers (for example S/A1 and S/A2) are grouped together in a staggered arrangement, as shown in FIG. 3, to form a memory cell array. Specifically, according to this embodiment of the present invention, the locations of the sense amplifiers in view from the pairs of bit lines are on the right, right, left, left, right, right, left, left and so on. This is in contrast to the conventional example which locates the sense amplifiers on the right, left, right, left, right, left, and so on. As a result of this embodiment, constant spaces 8 are formed between the ends of two pairs of bit lines and the opposing sense amplifier array (S/A Array). Specifically, a representative constant space 8 is a region bounded on the left by the right end points of two adjacent pairs of bit lines (BL2 and /BL2, and BL3 and /BL3), on the right by two adjacent sense amplifiers (S/A1 and S/A4) in the opposing sense amplifier array, on the top by the previous pair of bit lines (BL1 and /BL1), and on the bottom by the next pair of bit lines (BL4 and /BL4).

Each bit line BL is coupled to a dynamic-type memory cell composed of a transistor and a capacitor, not shown. Memory cells belonging to the same column are coupled to the same pair of bit lines (BL and /BL) and memory cells belonging to the same row are coupled to the same word line WL. The word lines are selectively driven by the row decode circuits R/D as previously explained. A row decode circuit includes at least a word line driving circuit for charging the word lines to "H" level by P-channel transistors. The drive signal supply circuits WDRV are used as drive sources and the Vpp generating circuits (Vpp Pump1 and Vpp Pump2), which generating a boosted potential Vpp, are used as power sources.

Figure 4:
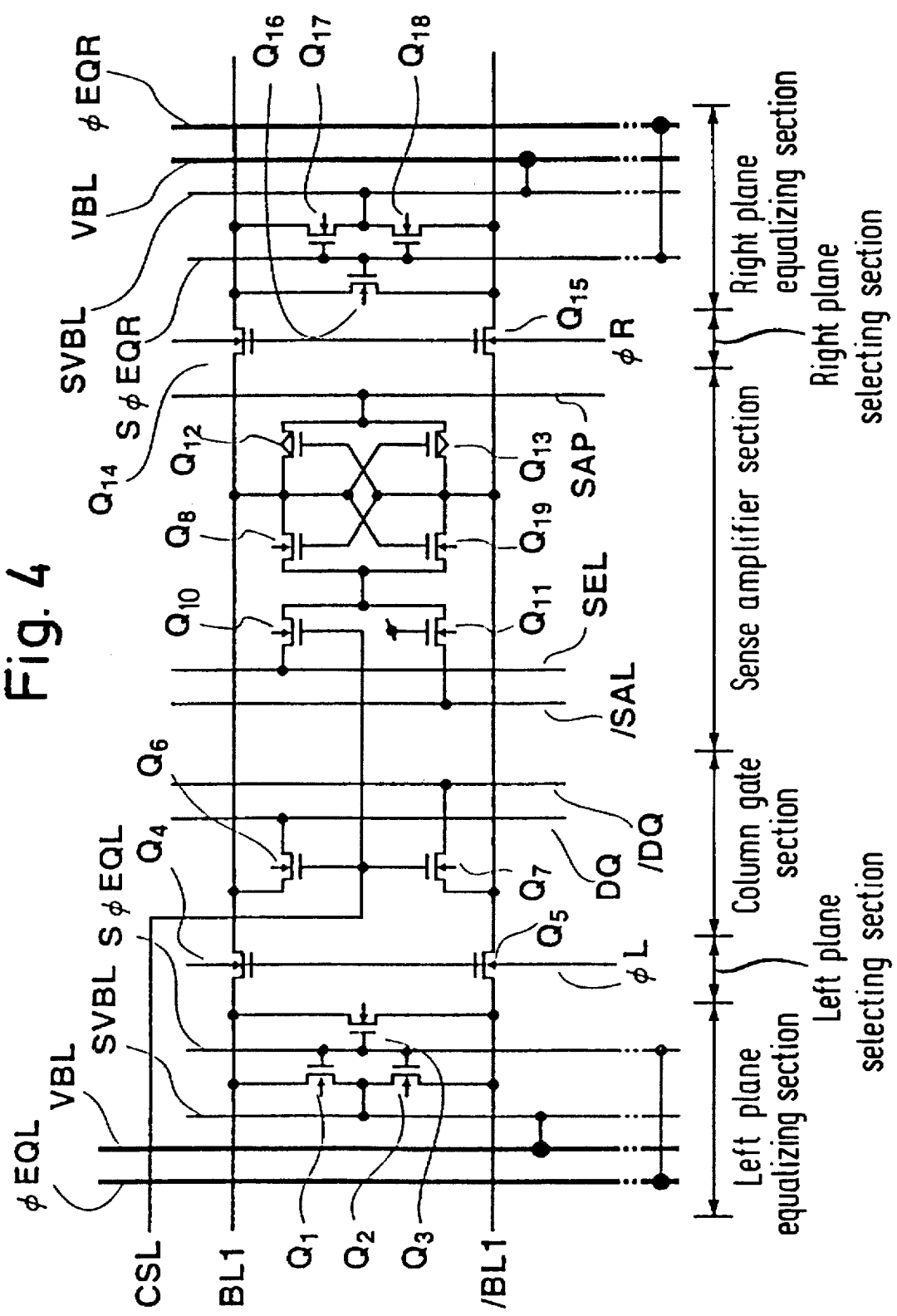
FIG. 4 is a structural diagram showing a sense amplifier circuit of the present invention.

FIG. 4 shows the detailed structure of the sense amplifier circuits S/A from FIG. 3. Much of this sense amplifier circuit is the same as in the conventional sense amplifier circuit, which was previously explained. The sense amplifier circuit S/A can be divided into a left plane equalizing section, a left plane selecting section, a column gate section, a sense amplifier section, a right plane selecting section, and a right plane equalizing section.

The left plane equalizing section, composed of the N-channel MOS transistors Q1, Q2 and Q3, equalizes the left plane pair of bit lines BL1 and /BL1 to ½ Vcc under the control of a signal SφEQL (½ Vcc is supplied by SVBL). The signal line SφEQL, which is commonly used by the gate electrodes of the MOS transistors Q1, Q2 and Q3, is formed from polysilicon wiring. Thus, it has a comparatively high resistance but its miniaturization is possible. Similarly, the supply line SVBL, which is commonly used for the drain electrodes of the MOS transistors Q1 and Q2, is formed from wiring made of impurity diffusion. Thus, it also has a comparatively high resistance but its miniaturization is possible. To compensate for these high resistance wirings, bypass lines φEQL and VBL, which are formed tom metal wiring layers, are arranged in parallel with the wirings of SφEQL and SVBL. The equalizing section wirings (SφEQL and SVBL) and the bypass lines (φEQL and VBL) are brought into contact with each other (that is, shunted) at the regions of the constant spaces 8.

The left plane selecting section, composed of the N-channel MOS transistors Q4 and Q5, couples the column gate section and the sense amplifier section to the left plane pair of bit lines BL1 and /BL1 under the control of a signal φL. The column gate section, composed of the N-channel MOS transistors Q6 and Q7, selectively couples the pair of bit lines to a pair of data lines DQ and /DQ under the control of the column select line CSL. The sense amplifier section is composed of the N-channel MOS transistors Q8 through Q11 and the P-channel MOS transistors Q12 and Q13. As previously explained, when the N-channel sense amplifier control lines /SAN and /SEL fill from ½ Vcc to 0V, the bit line having a lower potential is drawn to "L". Successively, a P-channel sense amplifier control line SAP rises from ½ Vcc to Vcc and the bit line having a higher potential is drawn to "H". In this way, the sense amplifier detects a very small potential difference between the pair of bit lines. The amplifying operation is rapidly performed by the MOS transistor Q10, especially with regard to a column selected by the column select line CSL. The right plane selecting section, composed of the N-channel MOS transistors Q14 and Q15, couples the column gate section and the sense amplifier section to a right plane pair of bit lines BL1' and /BL1' under the control of a signal φR.

The right plane equalizing section, composed of the N-channel MOS transistors Q16, Q17 and Q18, equalizes the right plane pair of bit lines BL1' and /BL1' to ½ Vcc under the control of a signal SφEQR (½ Vcc is supplied from SVBL). The signal line SφEQR, which is commonly used by the gate electrodes of the MOS transistors Q16, Q17 and Q18, is formed from polysilicon wiring. Thus, it has a comparatively high resistance but its miniaturization is possible. Similarly, the supply line SVBL, which is commonly used for the drain electrodes of the MOS transistors Q17 and Q18, is formed from wiring made of impurity diffusion. Thus, it also has a comparatively high resistance but its miniaturization is possible. To compensate for these high resistance wirings, bypass lines φEQR and VBL, which are formed from metal wiring layers, are arranged in parallel with the wirings of SφEQR and SVBL. The equalizing section wirings (SφEQR and SVBL) and the bypass lines (φEQR and VBL) are brought into contact with each other (that is, shunted) at the regions of the constant spaces 8.

Figure 5:
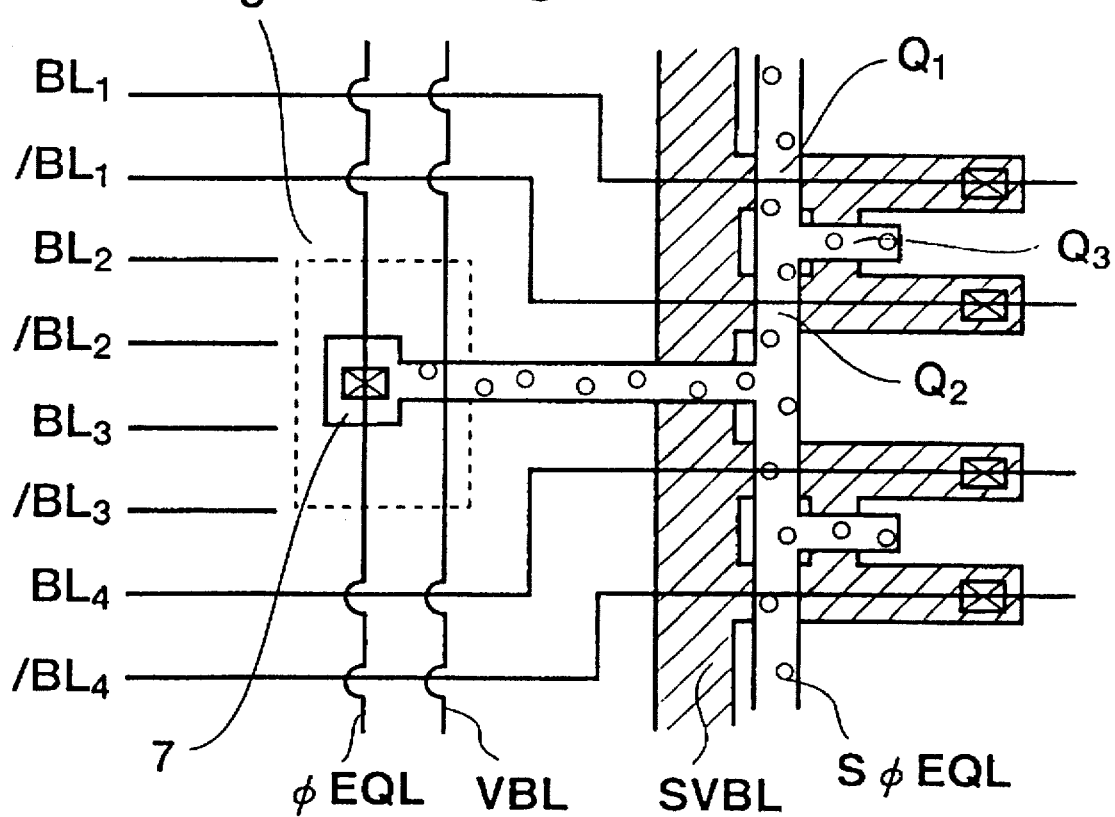
FIG. 5 is a plane view showing a pattern around a clearance portion of the present invention.

FIG. 5 shows a pattern diagram of one of the constant spaces 8 and its surroundings. The space 8 is a region contiguous to end portions of two adjacent pairs of bit lines (BL2 and /BL2, and BL3 and /BL3) and is bounded by two other pairs of bit lines (BL1 and /BL1, and BL4 and /BL4) and equalizing circuits in a sense amplifier array (MOS transistors Q1, Q2, Q3 etc.). In this space 8, there is formed a contact section 7 which brings the metal wiring and the polysilicon wiring in contact with each other. This requires a comparatively large region. At the contact section 7, the bypass line φEQL, which is illustratively constructed in a 0.7 μm wide metal (aluminum or tungsten) wiring layer of low resistance, is connected to the signal line SφEQL, which is illustratively constructed in a 0.35 μm wide polysilicon wiring layer of comparatively high resistance. The signal line SφEQL, constructed in the polysilicon wiring layer, vertically traverses the memory cell array and is commonly used by the gate electrodes of the MOS transistors Q1, Q2 and Q3. The hatched portion of FIG. 5 designates an impurity diffusion layer. A constant space 8 may be provided at every other group of sense amplifiers and it is not necessary to provide a contact region 7 for shunting φEQL and SφEQL at every constant space 8. Thus, the vacant spaces 8 can be used for shunting VBL and SVBL, as will now be explained.

Figure 6:
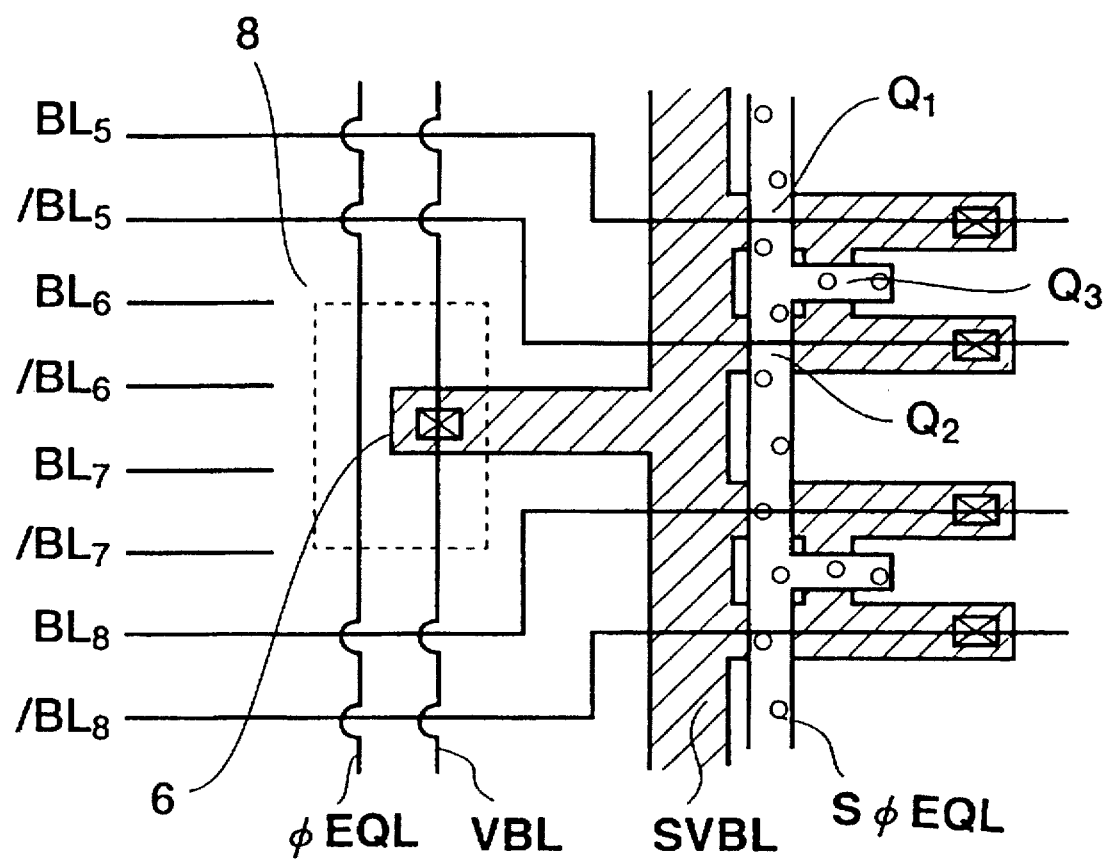
FIG. 6 is a plane view showing another pattern around a clearance portion of the present invention.

FIG. 6 shows a pattern diagram of another of the constant spaces 8 and its surroundings. This space 8 is a region contiguous to end portions of two adjacent pairs of bit lines (BL6 and /BL6, and BL7 and /BL7) and is bounded by two other pairs of bit lines (BL5 and /BL5, and BL8 and /BL8) and equalizing circuits in the sense amplifier array (MOS transistors Q1, Q2 and Q3 etc.). In this space 8, there is formed a contact section 6 which brings the metal wiring and the impurity diffusion layer wiring in contact with each other. This also requires a comparatively large region. (Naturally, it is possible to draw the electrode from the impurity diffusion layer to the polysilicon layer and to connect the polysilicon layer to the metal wiring layer. This is the same as has been explained by using FIG. 4.) At the contact section 6, the bypass line VBL, which is constructed in a 0.7 μm wide metal wiring layer of low resistance, is connected to the supply line SVBL, which is constructed of a 0.35 μm wide wiring in the impurity diffusion layer of comparatively high resistance. The supply line SVBL, constructed in the impurity diffusion layer, vertically transverses the memory cell array and is commonly used by the drain electrodes of the MOS transistors Q1 and Q2. The portion of FIG. 6 marked with small circles designates a polysilicon layer.

In the preceding description of an embodiment of the present invention, the example of shunting equalizing circuit signal and supply lines at the constant space 8 has been shown (in reference to FIGS. 5 and 6). Although the structure of the present invention can naturally be used for shunting other wirings, the above-explained embodiment is particularly suited to the shared sense amplifier structure because equalizing circuits are disposed at both ends of the sense amplifier circuits S/A.

In this way, it is possible to provide connection regions for signal and supply lines by using the bit lines/sense amplifiers arrangement of the present invention because the constant spaces can be provided between the pairs of bit lines and the sense amplifiers. Meanwhile, as in the conventional shared sense amplifier structure, the arrangement in the present invention maintains the mostly packed structure in the bit line arrangement. That is, one sense amplifier can be arranged at every two pairs of bit lines. As a result, low resistance in the equalizing circuit signal and supply lines can be achieved without increasing chip area.

Figure 7A:
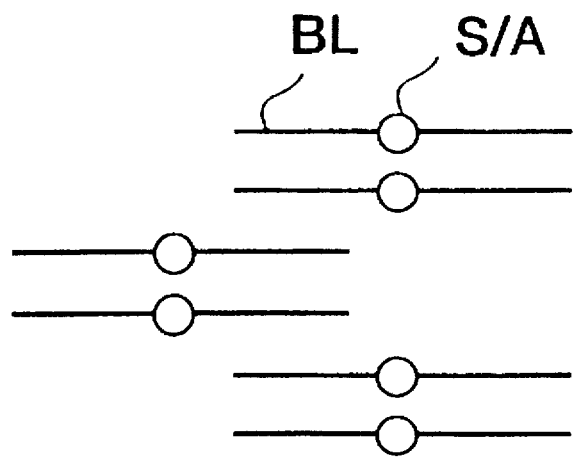
FIGS. 7(a) and 7(b) are plane views showing other embodiments of the present invention.
Figure 7B:
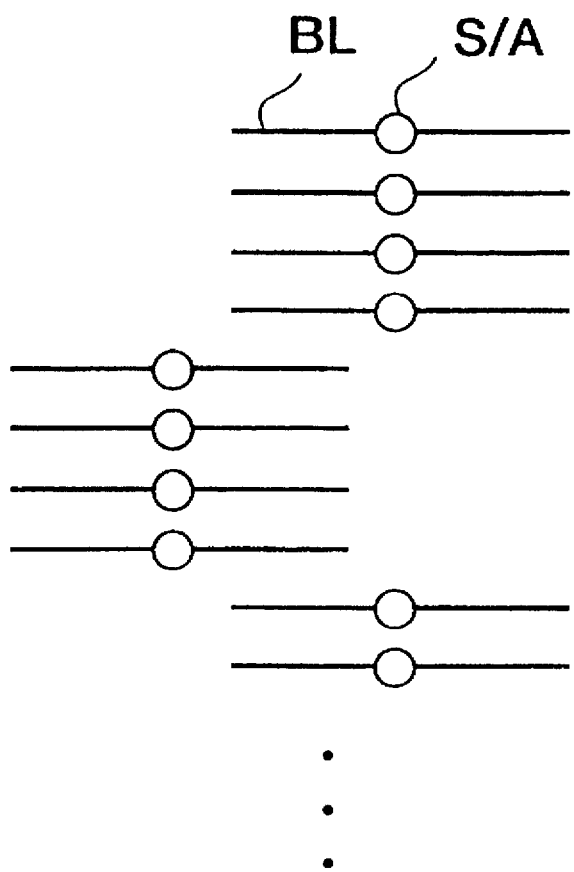
Figure 9:
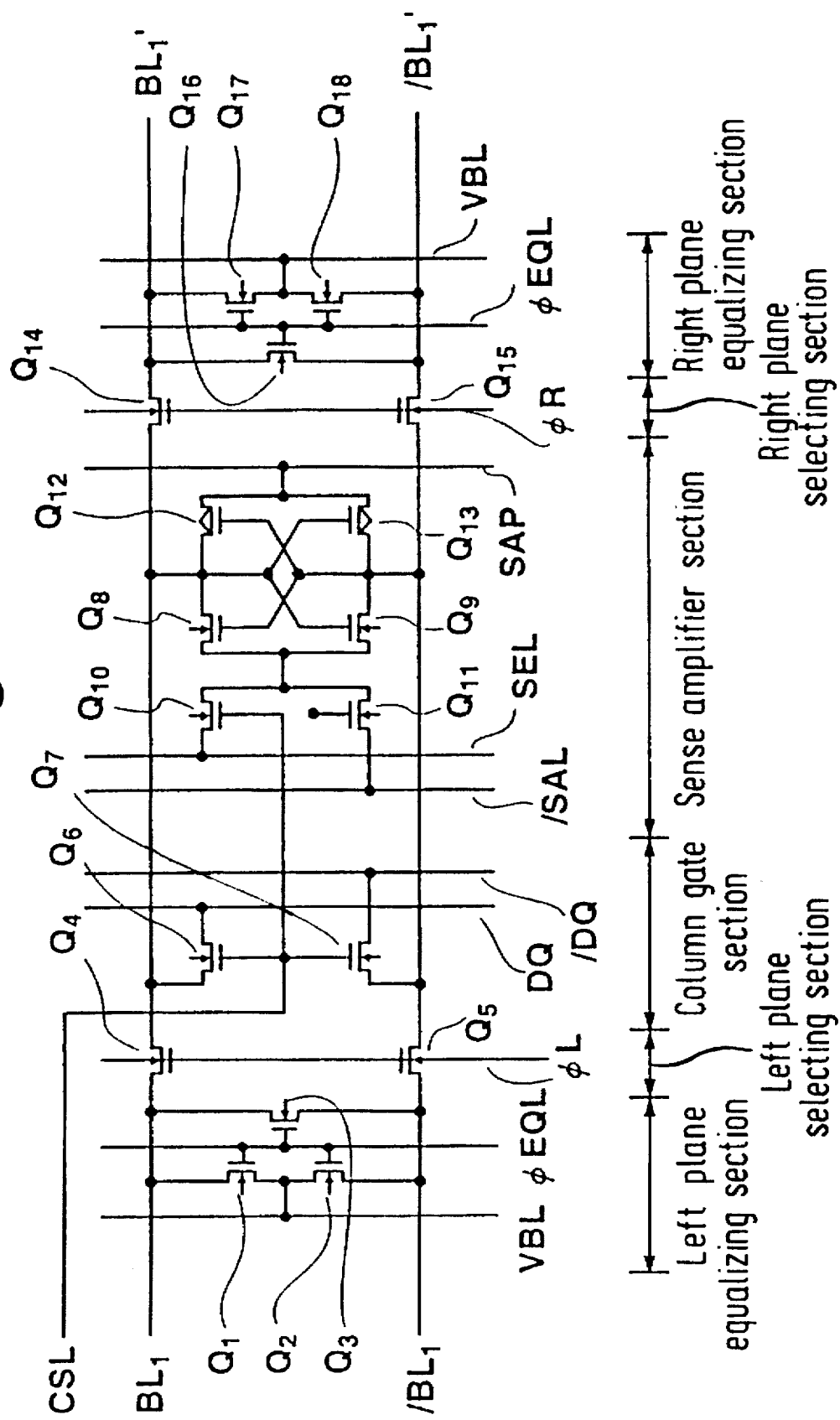
FIG. 9 is a structural diagram showing in detail a sense amplifier circuit of the conventional example.

Next, a second embodiment of the present invention will be explained in reference to FIGS. 7(a) and 7(b). FIG. 7(a) is a block view showing the bit lines/sense amplifiers arrangement of the previously-explained (first) embodiment of the present invention. FIG. 7(b) shows a modified example thereof. As in the first embodiment, the second embodiment uses a shared sense amplifier structure in which a pair of bit lines BL is connected to both the left and the right sides of each sense amplifier circuit S/A. According to the second embodiment, every four sense amplifiers are grouped together and arranged in a staggered arrangement, thereby constituting a memory cell array different from the first embodiment. Specifically, the locations of the sense amplifiers S/A in view from the pairs of bit lines BL are on the right, right, left, left, right, right, and so on in the first embodiment. By contrast, according to the second embodiment, the locations of the sense amplifiers S/A are on the right, right, right, right, left, left, left, left, right, right, right, right, and so on. As a result, constant spaces are formed between the four pairs of bit lines and the sense amplifier array. Thus, the constant spaces in the second embodiment have a larger area than those in the first embodiment. As a result, this arrangement is advantageous for the creation of a 256M bit DRAM and the like, wherein miniaturization of polysilicon pitch is more critical.

It is also possible to group more than four pairs of bit lines BL together (for example every eight pairs), by further advancing the embodiment in FIG. 7(b). Naturally, various modifications may be performed without deviating from the gist of the present invention.

As previously explained, the present invention provides a dynamic-type semiconductor memory which achieves low resistance of the equalizing signal lines and the like while maintaining a bit line arrangement of a mostly packed structure.

What is claimed is:

1. A semiconductor memory comprising:

a memory cell array including 2N (N≧2) bit line pairs arranged in columns, each of the bit line pairs coupled to a plurality of memory cells;

a first sense amplifier array having N first sense amplifier circuits arranged in a first column at one side of the memory cell array, each of the first sense amplifier circuits coupled to one of the bit line pairs, thereby coupling the first sense amplifier array to N of the bit line pairs;

a second sense amplifier array having N second sense amplifier circuits arranged in a second column at the opposite side of the memory cell array, each of the second sense amplifier circuits coupled to another of the bit line pairs, thereby coupling the second sense amplifier array to the other N of the bit line pairs; and a plurality of regions, each of the regions located between ends of M of the bit line pairs and one of the sense amplifier arrays, wherein a first signal line and a second signal line are shunted at one or more of the regions;

wherein a first group of M (M≧2) adjacent bit line pairs is distributed to one of the sense amplifier arrays and a second group of M adjacent bit line pairs bordering the first group is distributed to the other sense amplifier array.

2. The semiconductor memory according to claim 1, wherein each of the sense amplifier circuits includes an equalizing circuit for equalizing the corresponding bit line pairs with an intermediate voltage, the equalizing circuits having first, second and third MOS transistors, the first signal line is a wiring for controlling the first, the second, and the third MOS transistors and is integral with gate electrodes thereof, and the second signal line is a bypass wiring for supplying a control signal to the first signal line.

3. The semiconductor memory according to claim 2, wherein the first signal line is constructed in a polysilicon layer, and the second signal line is constructed in a metal wiring layer.

4. The semiconductor memory according to claim 1, wherein each of the sense amplifier circuits includes an equalizing circuit for equalizing the corresponding bit line pairs with an intermediate voltage, the first signal line is a wiring for providing the intermediate voltage to the equalizing circuit, and the second signal line is a bypass wiring for supplying the intermediate voltage to first signal line.

5. The semiconductor memory according to claim 4, wherein the first signal line is constructed in an impurity diffusion layer, and the second signal line is constructed in a metal wiring layer.

6. The semiconductor memory according to claim 1, wherein M is two.

7. The semiconductor memory according to claim 1, wherein M is four.

8. A semiconductor memory comprising:

a memory cell array including 2N (N≧2) bit line pairs arranged in columns, each of the bit line pairs coupled to a plurality of memory cells;

a first sense amplifier array having N first sense amplifier circuits arranged in a first column at one side of the memory cell array, each of the first sense amplifier circuits coupled to one of the bit line pairs, thereby coupling the first sense amplifier array to N of the bit line pairs; and a second sense amplifier array having N second sense amplifier circuits arranged in a second column at the opposite side of the memory cell array, each of the second sense amplifier circuits coupled to another of the bit line pairs, thereby coupling the second sense amplifier array to the other N of the bit line pairs, wherein a first group of M (M≧2) adjacent bit line pairs is distributed to one of the sense amplifier arrays and a second group of M adjacent bit line pairs bordering the first group is distributed to the other sense amplifier array, and each of the bit line pairs is jogged at the end near its corresponding sense amplifier circuit to create regions for shunting a first signal line and a second signal line, and to allow the sense amplifier circuits to be arranged at regular intervals.

9. A semiconductor memory comprising:

first, second, third and fourth adjacent bit line pairs arranged in this order in parallel;

a first sense amplifier circuit connected to the right end of the first bit line pair;

a second sense amplifier circuit connected to the left end of the second bit line pair;

a third sense amplifier circuit connected to the left end of the third bit line pair; and a fourth sense amplifier circuit connected to the right end of the fourth bit line pair, wherein the first sense amplifier is adjacent to the fourth sense amplifier, and the second sense amplifier is adjacent to the third sense amplifier.

10. A semiconductor memory comprising:

first, second, third and fourth bit line pairs arranged in this order in parallel;

a first sense amplifier circuit connected to the right end of the first bit line pair;

a second sense amplifier circuit connected to the left end of the second bit line pair;

a third sense amplifier circuit connected to the left end of the third bit line pair;

a fourth sense amplifier circuit connected to the right end of the fourth bit line pair; and a shunt region for shunting wirings in different layers, the shunt region being bounded by the right ends of the second and the third bit line pairs and the first and the fourth sense amplifier circuits.

11. The semiconductor memory according to claim 10, wherein each of the sense amplifier circuits includes an equalizing circuit, each of the equalizing circuits having MOS transistors for equalizing its corresponding bit line pair with an intermediate voltage.

12. A semiconductor memory comprising:

first, second, third and fourth bit line pairs arranged in this order in parallel;

a first sense amplifier circuit connected to the right end of the first bit line pair;

a second sense amplifier circuit connected to the left end of the second bit line pair;

a third sense amplifier circuit connected to the left end of the third bit line pair;

a fourth sense amplifier circuit connected to the right end of the fourth bit line pair;

a first equalizing signal line for providing a control signal for the MOS transistors, the first equalizing signal line being integral with gate electrodes of the MOS transistors;

a second equalizing signal line for bypassing the control signal; and a shunt region for shunting the first equalizing signal line and the second equalizing signal line, the shunt region being bounded by the right ends of the second and the third bit line pairs and the first and the fourth sense amplifier circuits, wherein each of the sense amplifier circuits includes an equalizing circuit, each of the equalizing circuits having MOS transistors for equalizing its corresponding bit line pair with an intermediate voltage.

13. The semiconductor memory according to claim 12, wherein the first equalizing signal line is constructed in a polysilicon layer, and the second equalizing signal line is constructed in a metal wiring layer.

14. A semiconductor memory comprising:

first, second, third and fourth bit line pairs arranged in this order in parallel;

a first sense amplifier circuit connected to the right end of the first bit line pair;

a second sense amplifier circuit connected to the left end of the second bit line pair;

a third sense amplifier circuit connected to the left end of the third bit line pair;

a fourth sense amplifier circuit connected to the right end of the fourth bit line pair;

a first intermediate voltage line for providing the intermediate voltage for source/drain electrodes of the MOS transistors;

a second intermediate voltage line for bypassing the intermediate voltage; and a shunt region for shunting the first intermediate voltage line and the second intermediate voltage line, the shunt region being bounded by the right ends of the second and the third bit line pairs and the first and the fourth sense amplifier circuits, wherein each of the sense amplifier circuits includes an equalizing circuit, each of the equalizing circuits having MOS transistors for equalizing its corresponding bit line pair with an intermediate voltage.

15. The semiconductor memory according to claim 14, wherein the first intermediate voltage line is constructed in an impurity diffusion layer, and the second intermediate voltage line is constructed in a metal wiring layer.

16. A semiconductor memory comprising:

first, second, third, fourth, fifth, and sixth bit line pairs arranged in this order in parallel;

a first sense amplifier circuit connected to the right end of the first bit line pair;

a second sense amplifier circuit connected to the left end of the second bit line pair;

a third sense amplifier circuit connected to the left end of the third bit line pair;

a fourth sense amplifier circuit connected to the left end of the fourth bit line pair;

a fifth sense amplifier circuit connected to the left end of the fifth bit line pair; and a sixth sense amplifier circuit connected to the right end of the sixth bit line pair.

17. The semiconductor memory according to claim 16, further comprising a shunt region for shunting wirings in different layers, the shunt region being bounded by the right ends of the second to the fifth bit line pairs and the first and the sixth sense amplifier circuits.

18. The semiconductor memory according to claim 16, wherein each of the sense amplifier circuits includes an equalizing circuit, each of the equalizing circuits having MOS transistors for equalizing its corresponding bit line pair with an intermediate voltage.

19. The semiconductor memory according to claim 18, further comprising:

a first equalizing signal line for providing a control signal for the MOS transistors, the first equalizing signal line being integral with gate electrodes of the MOS transistors;

a second equalizing signal line for bypassing the control signal; and a shunt region for shunting the first equalizing signal line and the second equalizing signal line, the shunt region being bounded by the right ends of the second to the fifth bit line pairs and the first and the sixth sense amplifier circuits.

20. The semiconductor memory according to claim 18, further comprising:

a first intermediate voltage line for providing the intermediate voltage for source/drain electrodes of MOS transistors;

a second intermediate voltage line for bypassing the intermediate voltage; and a shunt region for shunting the first intermediate voltage line and the second intermediate voltage line, the shunt region being bounded by the right ends of the second to the first bit line pairs and the first and the sixth sense amplifier circuits.

* * * * *